United States Patent
Hofmann

(10) Patent No.: US 7,044,212 B1
(45) Date of Patent: May 16, 2006

(54) REFRIGERATION DEVICE AND A METHOD FOR PRODUCING THE SAME

(75) Inventor: Wilfried Hofmann, Munich (DE)

(73) Assignee: NET Nanofiltertechnik GmbH, Munich (DE)

( * ) Notice: Subject to any disclaimer, the term of this patent is extended or adjusted under 35 U.S.C. 154(b) by 233 days.

(21) Appl. No.: 10/362,865

(22) PCT Filed: Aug. 25, 2000

(86) PCT No.: PCT/EP01/09089

§ 371 (c)(1),
(2), (4) Date: Jul. 15, 2003

(87) PCT Pub. No.: WO02/17390

PCT Pub. Date: Feb. 28, 2002

(30) Foreign Application Priority Data

Aug. 25, 2000 (DE) .............................. 100 41 829
Sep. 28, 2000 (DE) .............................. 100 49 274

(51) Int. Cl.
*F28F 7/02* (2006.01)

(52) U.S. Cl. ....................................... 165/185; 165/80.2

(58) Field of Classification Search ................ 165/185, 165/80.3, 80.2
See application file for complete search history.

(56) References Cited

U.S. PATENT DOCUMENTS

| | | | | |
|---|---|---|---|---|
| 4,962,416 A * | 10/1990 | Jones et al. | .................. | 257/722 |
| 5,002,123 A * | 3/1991 | Nelson et al. | .............. | 165/185 |
| 5,018,573 A * | 5/1991 | Zohler et al. | ................ | 165/133 |
| 5,285,350 A * | 2/1994 | Villaume | .................... | 165/80.3 |
| 5,345,107 A * | 9/1994 | Daikoku et al. | ............. | 165/185 |
| 5,455,382 A * | 10/1995 | Kojima et al. | ............. | 165/80.3 |
| 5,476,818 A * | 12/1995 | Yanof et al. | .................. | 29/832 |
| 5,504,378 A | 4/1996 | Lindberg et al. | | |
| 5,506,753 A | 4/1996 | Bertin et al. | | |
| 5,781,411 A * | 7/1998 | Feenstra | .................... | 165/80.3 |
| 5,896,271 A * | 4/1999 | Jensen et al. | .............. | 165/80.3 |
| 6,043,986 A | 3/2000 | Kondo et al. | | |
| 6,478,082 B1 * | 11/2002 | Li | ............................... | 165/185 |
| 2002/0043364 A1 * | 4/2002 | Suzuki et al. | ............... | 165/185 |

FOREIGN PATENT DOCUMENTS

| | | |
|---|---|---|
| DE | 79 13 126 U1 | 8/1979 |
| DE | 82 28 451.2 U1 | 2/1983 |

(Continued)

OTHER PUBLICATIONS

Van Leyen, V.D., Wärmeübertragung, Grundlagen und Berechnungsbeispiele aus der Nachrichtentechnik, Siemens Verlag, 1971, pp. 16-21 and 96-103.

*Primary Examiner*—Teresa J. Walberg
(74) *Attorney, Agent, or Firm*—Senniger Powers

(57) ABSTRACT

The cooling device, particularly for electronic components, such as microprocessors, consists of a substrate (1), which features a heat-inlet surface that is in thermal contact with an object (6) to be cooled and a heat-dissipation surface. The heat-dissipation surface has a defined structure, preferably in the form of continuous channels (2), and has a significantly larger surface area than the heat-inlet surface. At least the heat-inlet surface, but preferably also all or significant portions of the heat-dissipation surface are provided with a thin coating (3) made of heat-conductive material. Another improvement is obtained because the surface features a coating made of fine particles (21), e.g., made of metal or metal oxide, which further increases the surface area.

30 Claims, 6 Drawing Sheets

FOREIGN PATENT DOCUMENTS

Figures 2A, 2B, 2C, 2D, 2E, 2F:
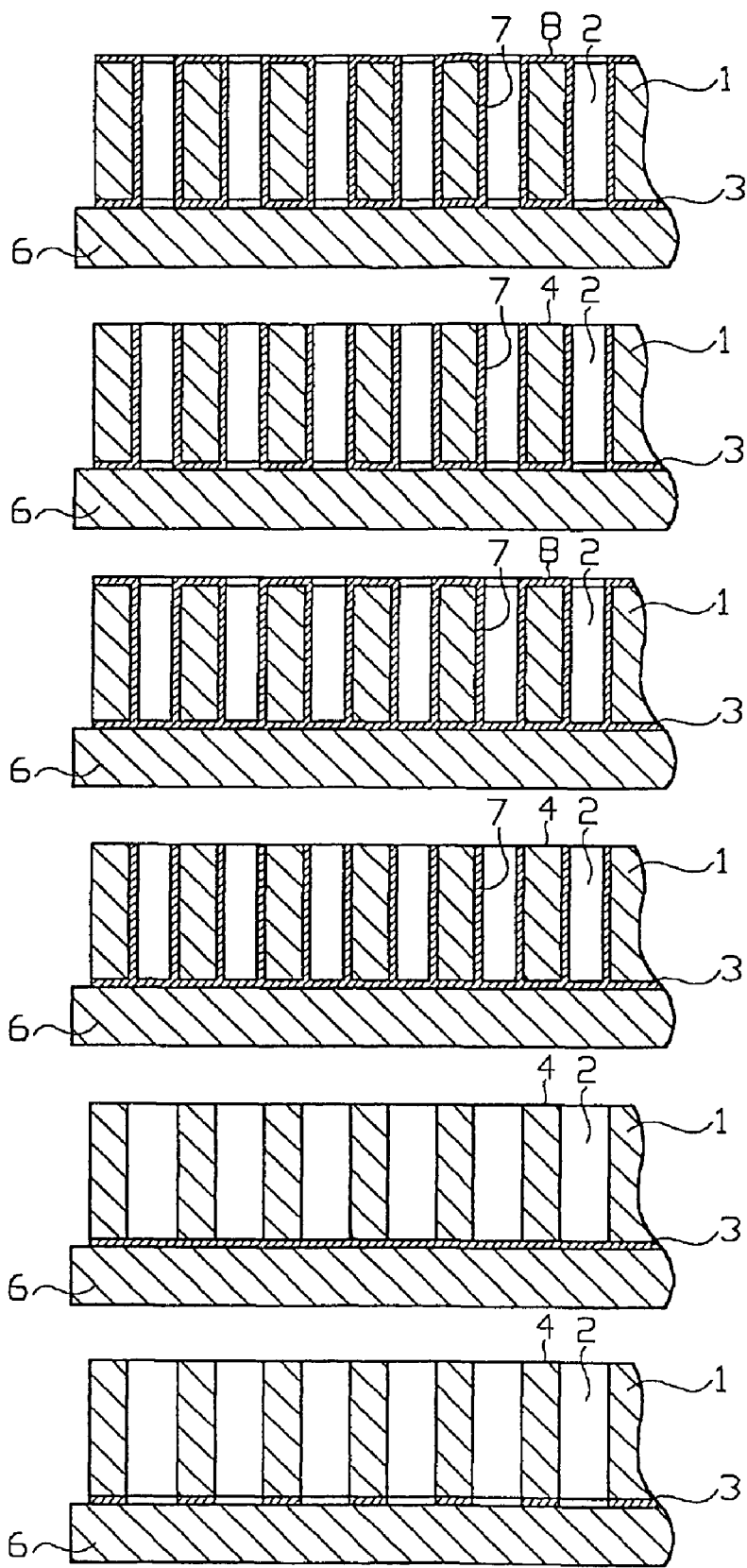

| | | |
|---|---|---|
| DE | 223 570 A1 | 6/1985 |
| DE | 85 33 265.8 U1 | 4/1986 |
| DE | 89 08 678.3 U1 | 1/1991 |
| DE | 92 14 061.0 U1 | 2/1993 |
| DE | 44 42 023 C2 | 5/1996 |
| DE | 196 19 060 A1 | 11/1997 |
| DE | 196 41 731 A1 | 1/1998 |
| DE | 197 44 281 A1 | 6/1999 |
| DE | 198 23 223 A1 | 12/1999 |
| DE | 196 26 227 C2 | 4/2002 |
| EP | 0 308 576 A2 | 3/1989 |
| WO | WO 02/17390 A2 | 2/2002 |

* cited by examiner

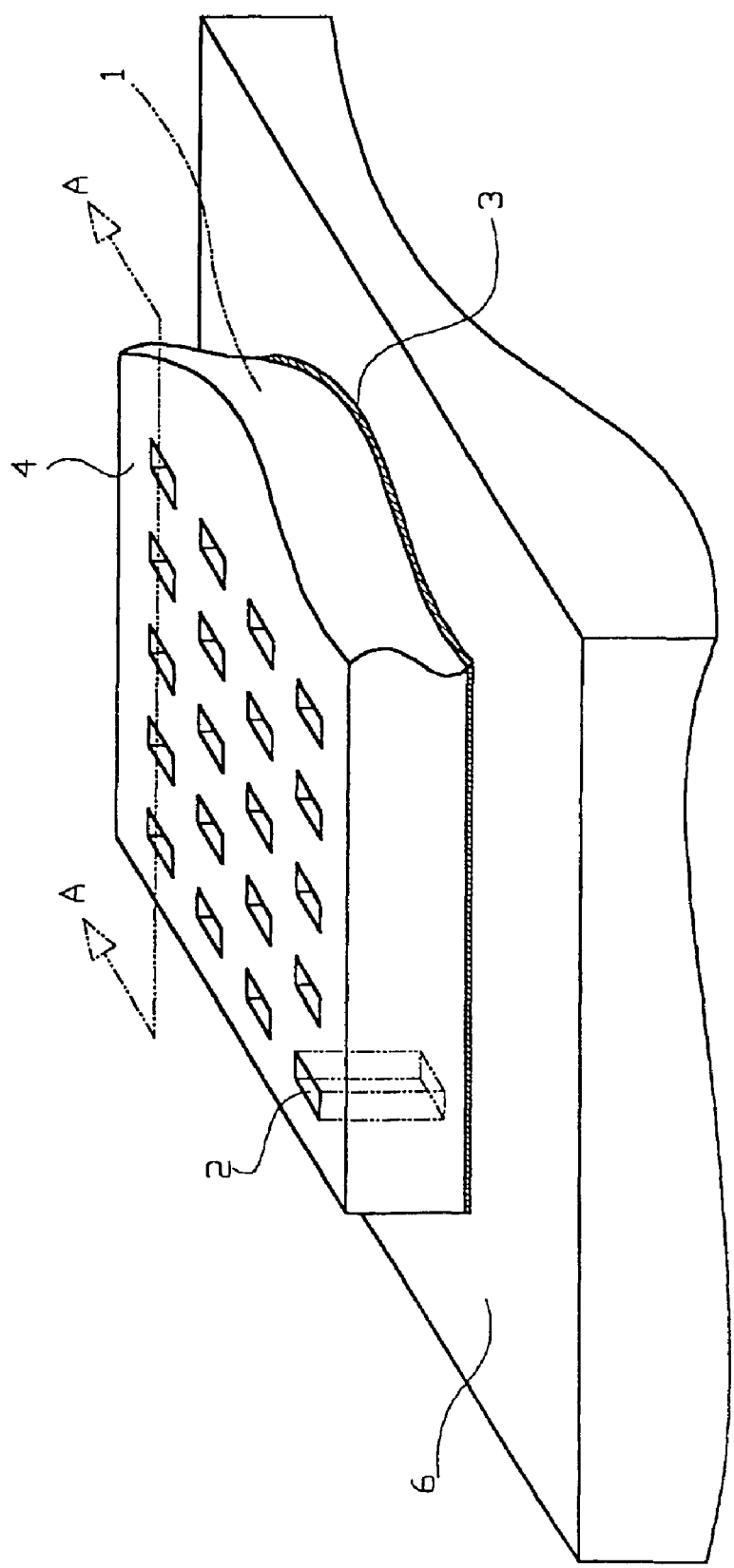

REFRIGERATION DEVICE AND A METHOD FOR PRODUCING THE SAME

The invention concerns a cooling device and also a process for its production. More specifically, it concerns a passive cooling device for cooling electrical and electronic components. Electrical and electronic components, such as, e.g., microprocessors, dissipate energy that limits or decreases the operating efficiency of such units. For example, if the operating temperature of a microprocessor is reduced from 100° C. to 0° C., then the clock frequency can be increased by more than 30%. Apart from an increase in power, overheating can lead to breakdown. Overheating of such components also negatively reduces their service life. Typically, for cooling and dissipating heat generated by electronic components, passive and active cooling devices, such as, e.g., heat sinks with ribs and/or fans with motors, are used. Heat sinks (if necessary, together with fans) should have a weight that is as low as possible, so that the circuit board is not mechanically stressed, which can lead to cracks in fine wiring. Active cooling devices, such as, e.g., fans, have more disadvantages. They require electrical energy, they have larger space requirements, they generate noise, and they generate relatively high initial costs and later also operating costs. If the active cooling device breaks down, the component (e.g., the processor) heats up quickly and without warning, so that the component can be damaged or even destroyed.

DE 196 26 227 C2 describes a cooling device that operates according to the principle of "heat pipes." Heat-pipe structures are devices that are used to transfer heat from the place of origin to another location. A liquid with a high latent heat of evaporation is evaporated in the hot region of the arrangement. The pressure resulting from the evaporation drives the vapor to the cold part of the arrangement. There, the vapor condenses into the liquid phase and dissipates the transported heat. The liquid condensate is fed back again to the evaporation site, which closes the loop. The setup and production of such a cooling device is cost-intensive and complicated and thus also expensive.

DE 197 44 281 A1 describes a cooling device for cooling semiconductor components according to the heat-pipe principle, i.e., a similar heat-pipe structure with a housing, which features several capillary structures saturated with coolant. The permeability, cross-sectional area, and effective pore diameter of the capillary structures are adjusted to produce a high capillary pressure. Within the housing there are additional channels that have a larger cross-sectional area than the capillary structure, so that the channels exhibit a significantly lower capillary pressure than the capillary structure. Here, the setup and production are also rather expensive.

DE 196 41 731 A1 describes a device for cooling arc generators with at least two electrodes, of which at least one electrode has a corresponding porous heat sink. The porous heat sink is formed as a sintered element, which is either pressed in a mold and inserted into the anode or mechanically processed. The sponge-like porous heat sink has fine channels, through which a gas flows. The heat sink is used such that generated heat is fed to the combustion process, so that heat losses are reduced to a minimum. Tungsten has been proposed as a particularly suitable material for this heat sink.

The task of the invention is to create a cooling device, which avoids the disadvantages of the state of the art mentioned above and which can be produced cost-effectively with good cooling power. It is further a task of the invention to create a process for producing such a cooling device.

These tasks are solved by the features given in claims 1 and 13, respectively. Advantageous configurations and refinements of the invention can be found in the subordinate claims.

The basic principle of the invention consists in that the cooling device is a substrate with a predetermined structure and with a large surface area relative to its projection surface. A heat-conductive layer is preferably applied to at least one part of the surface of the structured substrate. The predetermined structure of the substrate preferably includes a plurality of channels of suitable geometry, which preferably extend through the thickness of the substrate, so that the ratio of the heat-dissipation surface to the heat-inlet surface is very large and orders of magnitude up to a factor of 700 or more can be assumed. The predetermined structure concerns the shape, size, number, and spatial distribution of channels, which, in contrast to the sintered body of the state of the art, can be clearly predetermined and reproduced, so that all cooling devices of the invention also have this reproducible cooling power.

The original patent solves these tasks in that the heat-dissipation surface is significantly greater than the heat-inlet surface due to a predetermined structure. The structure is preferably formed in this region by channels, which extend through the substrate. Preferably, a few or all surfaces in this region can be provided with a heat-conductive coating.

The present application for patent of addition improves the solution according to the original patent in that the heat-dissipation surface is further increased such that it has a rough surface. This is preferably realized by applying small particles made of a material with a good coefficient of thermal conduction, which can be realized directly on the structured substrate or on the heat-conductive coating. The particles are on the order of magnitude of a few µm or smaller down to the range of a few nanometers (nm). Such particles with heat-conduction properties can consist of Al, Cu, Ag, Au, or also of metal oxides, such as, e.g., iron oxide. Instead of individual particles, a porous, sponge-like thin oxide layer can also be applied.

The production process includes the step:
forming a defined substrate structure, preferably with channels with clearly established shape, size, number, and spatial distribution,
and according to an advantageous refinement of the invention, the step:
applying a heat-conductive layer on at least one part of the surface of the structured substrate.

For one embodiment of the invention, the substrate consists of silicon or a similar material. The structure of the substrate is formed with etching processes, like those known within the semiconductor industry. The structure, and particular the channels, is formed in a precisely defined way, in that, e.g., the number, dimensions, geometry, and spatial arrangement or spatial distribution of the channels is predetermined. The selection of these parameters can achieve a ratio of heat-dissipation surface to heat-inlet surface of 400 to 700 or more. This means that, for a heat-source surface area (heat inlet surface area) of 1 cm$^2$, there is a surface area of 400 to 700 cm$^2$ or more available for the dissipation of heat. In this way, a very large amount of heat can be dissipated very simply from a heat source.

The heat-conductive layer is made from material with high thermal conductivity, such as, e.g., silver, copper, aluminum, or the like. This layer is thin relative to the thickness of the substrate, and preferably the ratio is under 50%.

According to one configuration of the invention, the heat-inlet surface is also structured, preferably in the form of channels, which run parallel to this surface and which can be in flow connection with the channels extending through the thickness of the substrate. In this way, an ambient coolant, such as, e.g., air or also other gases or liquids, is forced to flow to provide heat removal, which improves the heat transport.

Figure 3:
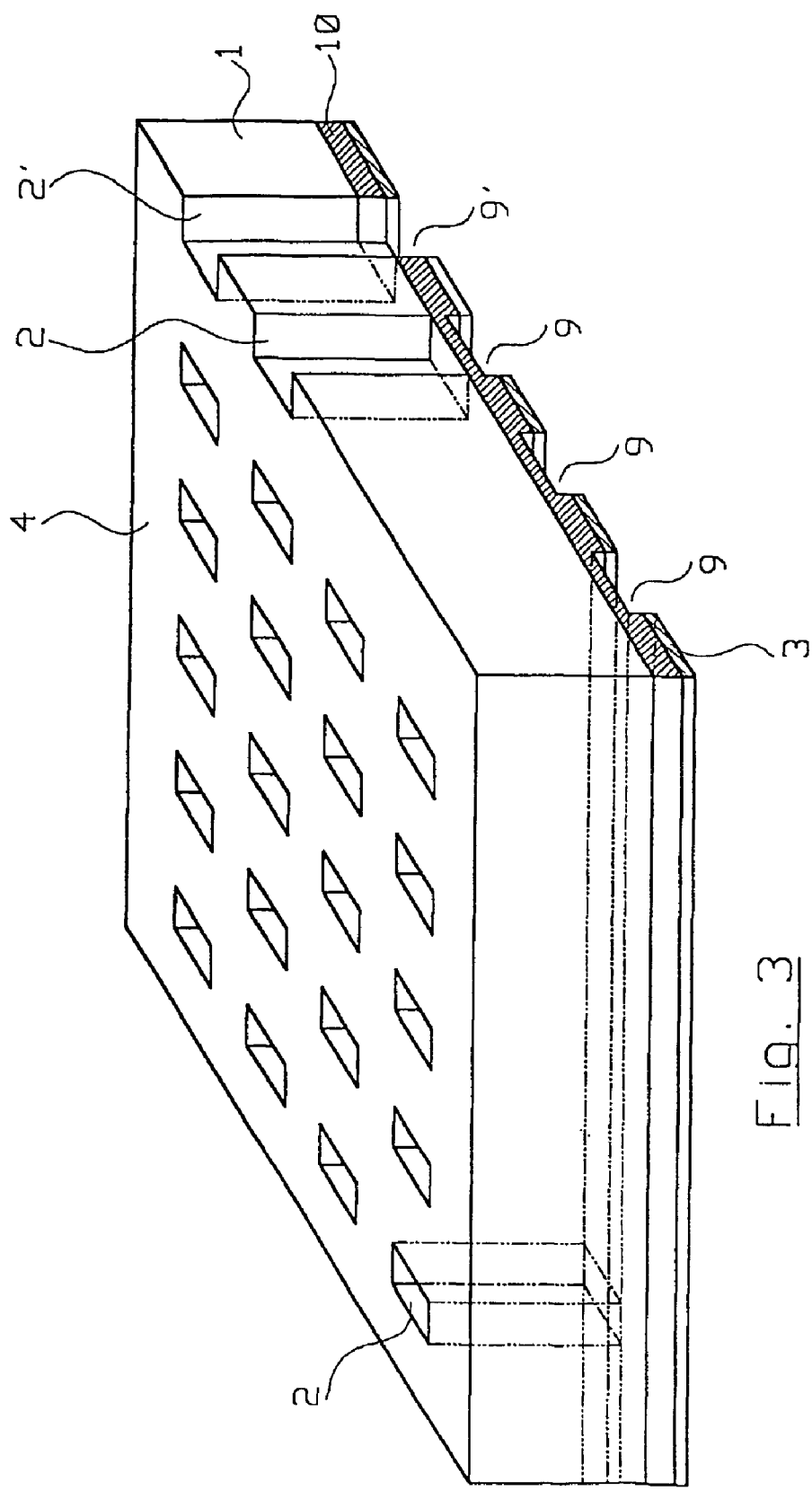
Figure 4A:
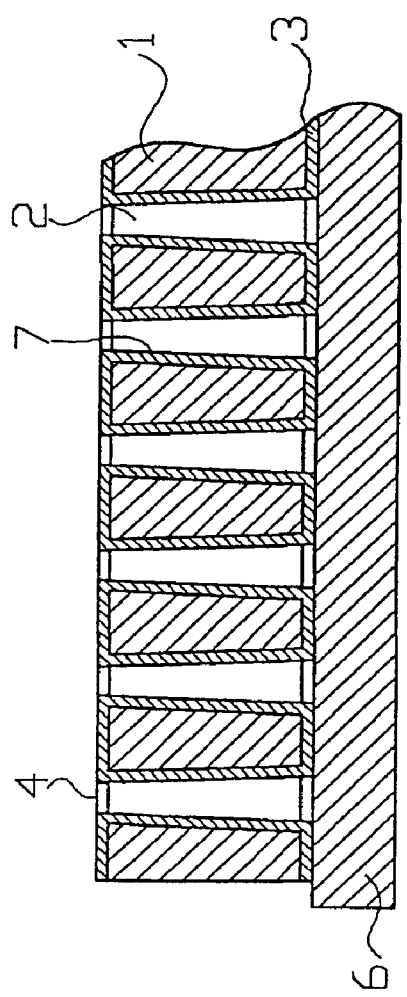
Figure 4B:
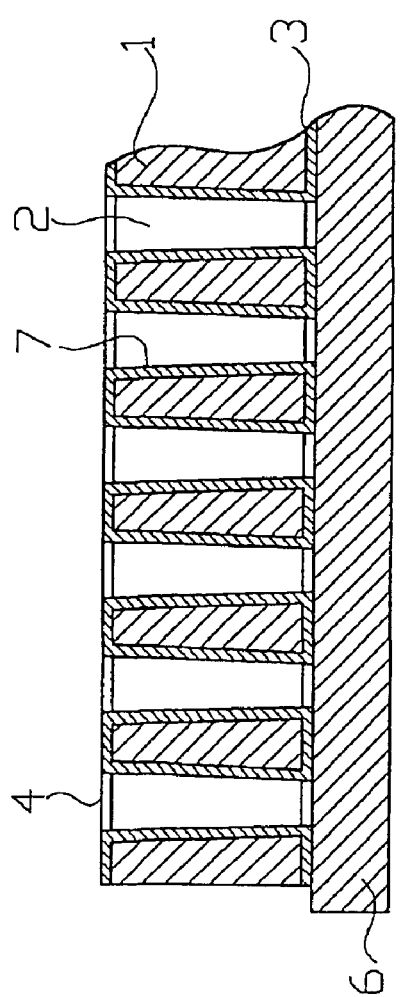
Figure 5:
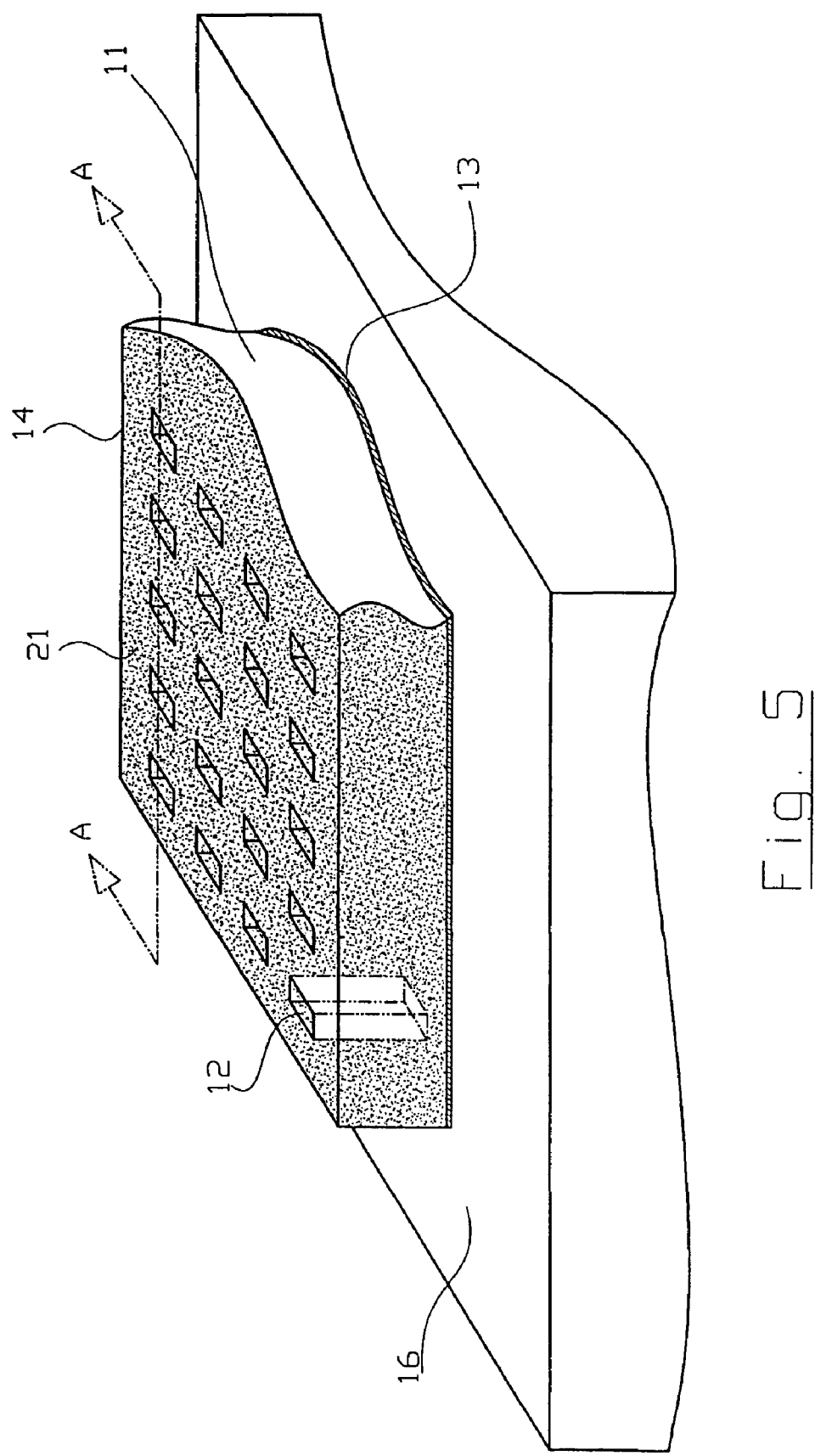

In the following, the invention is described in more detail with reference to embodiments in connection with the drawing. Shown are:

FIG. 1 a perspective view of a cooling device according to a first embodiment of the invention;

FIGS. 2a–2f a cross section of the cooling device of FIG. 1 with different variants of the heat-conductive layer;

FIG. 3 a perspective view similar to FIG. 1 according to a second embodiment of the invention;

FIGS. 4a and 4b a perspective view similar to FIG. 3 with vertical channels with different cross sections;

FIG. 5 a perspective view of a cooling device according to the invention; and

Figure 6:
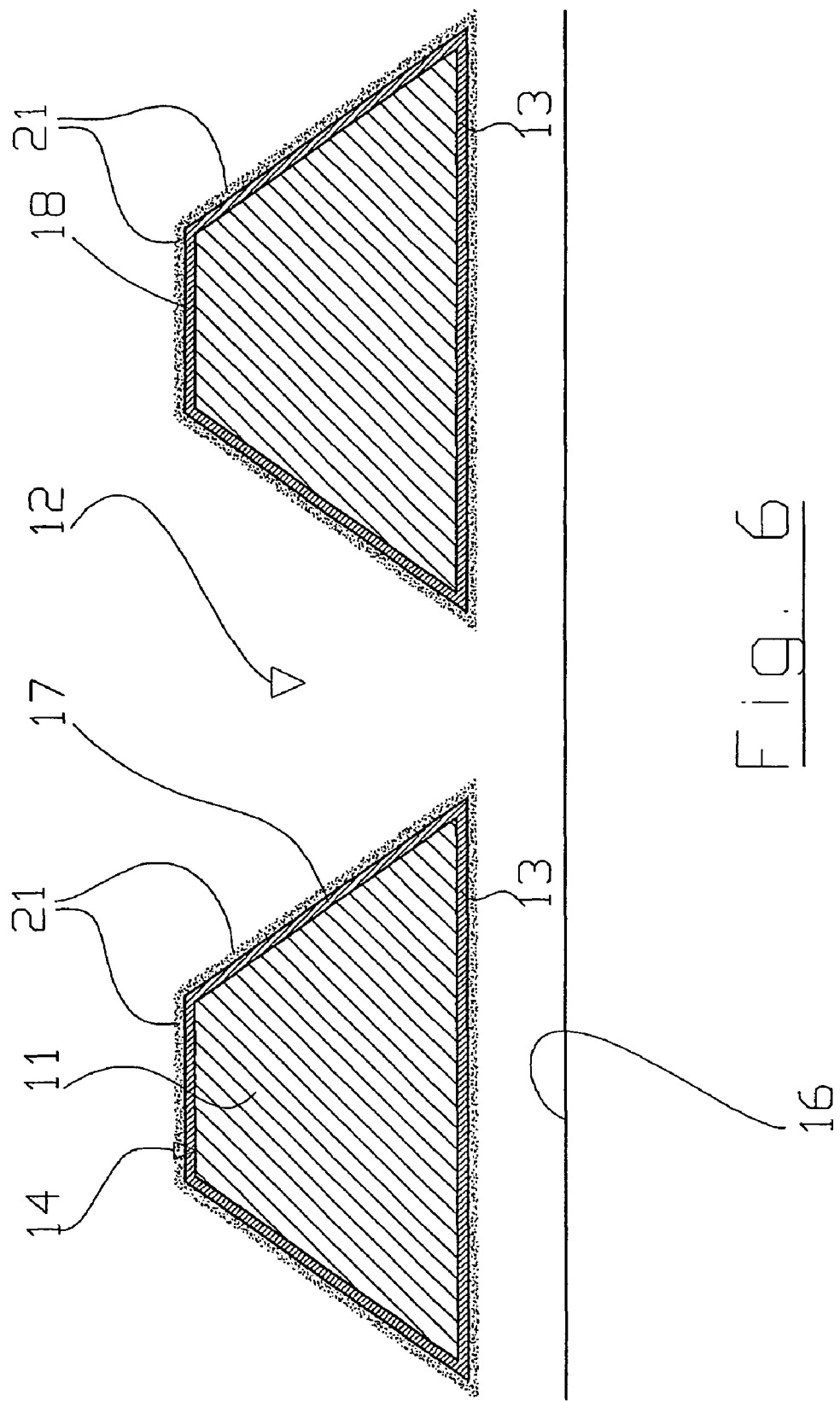

FIG. 6 a schematic cross section of a substrate according to the invention with inclined channel walls.

In FIG. 1, a substrate 1 can be seen, which features a plurality of channels 2 that extend through the thickness of the substrate 1. Here, the substrate is a rectangular body with one surface that features a layer 3 made of heat-conductive material. This surface will be referred to in the following as the heat-inlet surface. It is in direct contact with an object 6 to be cooled, which can be, e.g., a microprocessor, a chip, another type of electronic or electrical component, or even another type of body to be cooled.

The substrate 1 consists of, e.g., silicon or a similar material. The structure of the substrate, i.e., here the channels 2, is formed with the help of suitable lithography and etching processes, such as those used in the semiconductor industry. Thus, the structure can be formed in a precisely defined way, in that, e.g., the number, dimensions, as well as arrangement or spatial distribution of the channels 2 can be predetermined. By selecting the parameters, a ratio of heat-dissipation surface to heat-inlet surface of 400 to 700 or more can be achieved. Here, the heat-dissipation surface is not only the surface 4 of the substrate, but primarily the relatively much larger inner surface of the channels 2. This inner surface 4, as well as the side surfaces, with the exception of the heat-inlet surface, form the heat-dissipation surface.

The substrate provided with the heat-conductive layer 3 is preferably attached to the heat source 6 with the use of a heat-conductive compound, e.g., with a heat-conductive adhesive. The heat-conductive compound can, but it does not have to be formed with the same material as the heat-conductive layer. The diameter of the channels 2 is very small relative to the heat-inlet surface and is preferably on the order of magnitude of 10–50μ.

The ratio of heat-dissipation surface to heat-inlet surface is significantly greater than 1 and preferably significantly greater than 100.

The heat-conductive layer 3 has a high coefficient of thermal conduction. The heat-conductive layer 3 can be, e.g., copper, which has significantly higher thermal conductivity than aluminum. However, copper has a significantly higher specific weight than aluminum, which means a heat sink that is made completely out of copper has a relatively high weight and thus a circuit board, such as, e.g., a motherboard of a computer, would be exposed to considerable mechanical loads. For the invention, the heat-conductive layer 3 is thin relative to the thickness of the substrate 1, and preferably the layer 3 has a thickness of only <10μ, while the thickness of the substrate 1 is on the order of magnitude of 1 mm. With this very thin layer made of heat-conductive material, such as, e.g., copper, the problems of mechanical stresses are eliminated because the total weight of the cooling device is very low. The contact between the heat source 6 and the cooling device must be total, i.e., it must extend over the entire area of the cooling device. For this purpose, the heat-conductive layer 3 can be applied in a fluid or semi-fluid way and then actively or passively fixed. By applying the heat-conductive layer in a fluid or semi-fluid form, an optimum contact between the substrate and the heat source can be generated. Because the surface of the heat source is generally not completely planar and smooth, possible irregularities of the heat-source surface, which would lead to only a point-wise contact between the substrate and the heat source and thus to worse heat coupling between these components, are compensated for by the fluid or semi-fluid heat-conductive layer. The heat-conductive layer can be made from numerous materials, such as, e.g., silicon, heat-conductive paste, aluminum, copper, silver, etc.

The total dimensions of the cooling device are relatively small. The area essentially corresponds to the radiating area of the object 6 to be cooled. In contrast, the thickness is significantly smaller than the length of the longer edge of the base and is preferably in the range of 1 mm, whereby the heat-conduction path is very short. This creates good heat coupling between the heat source or the heat-inlet surface and the total, relatively extremely large heat-dissipation surface. Thus, the heat transport is performed very quickly and the cooling power is outstanding.

The dissipation of the heat from the heat source 6 is performed in the simplest case by transmitting energy received in the heat-conductive layer 3 of the structured substrate 1 to the ambient medium, i.e., e.g., air. The ambient medium is heated and flows through the structured substrate into the ambient air. The convection flow begins gradually because after the heat source is turned on, it also heats up only gradually. There is further improvement if the entire heat-dissipation surface is coated with the heat-conductive layer, i.e., also the inner walls of the channels 2, the surface 4, and the side surfaces. Here, diverse variants are possible, of which a few are illustrated in FIGS. 2a to 2f.

In FIG. 2a, all surfaces of the substrate 1 are coated with the heat-conductive layer, i.e., the bottom side is coated with the layer 3, the inner walls of the channels 2 with the layer 7, and the surface with the layer 8.

For the embodiment of FIG. 2b, the bottom side is coated with the layer 3 and the inner walls of the channels 2 are coated with the layer 7, while the surface 4 is not coated.

In the embodiment of FIG. 2c, the entire bottom side of the substrate 1 is covered with the layer 3, i.e., the bottom side of the channels 2 is also sealed by the layer 3. Otherwise, as for FIG. 2a, all other surfaces are also coated.

For the embodiment of FIG. 2d, the channels 2 are sealed, in turn, with the layer 3, but the surface 4 is not coated.

In the embodiment of FIG. 2e, the entire bottom side of the substrate 1 is coated so that the channels 2 are also sealed towards the bottom by the layer 3. The other surfaces have no coating.

In FIG. 2f, only the bottom side is provided with the layer 3 so that the channels 2 are open towards the bottom. All other surfaces are again not coated.

In FIGS. 1 and 2, the channels have a rectangular cross section. Obviously, other cross sections can also be used, such as, e.g., cylinders or other arbitrary shapes.

To support the flow of the heated medium in the channel in the vertical direction, the cross section of the channels, as shown in FIG. 4a, can also be tapered, i.e., they can have a diameter that decreases, e.g., in the direction from the heat-inlet surface towards the surface. Through this geometry, in connection with the speed of the coolant (e.g., air) a pressure drop can be generated in the channel. The lower pressure in the top region of the channel supports the removal of the heated medium and thus the cooling efficiency of the cooling device. In the case that the channels have cross sections that change over the channel length, convection flow is especially supported if the channel dimensions are designed to decrease in the desired direction of flow over the entire path length of the fluid. Thus, in FIG. 4a the preferred direction of flow is from the object 6 to be cooled through the channels 2 to the surface 4 of the substrate 1. The Bernoulli equation supplies the following relationship:

$$pp_0 = \tfrac{1}{2}\rho V^2 [A^2/A_0^2 - 1]$$

p and $p_0$, as well as A and $A_0$, represent the bridges or cross-sectional areas of two spatially separated points in the channels. V is the flow rate of the fluid in the channel.

Thus, the flow direction does not absolutely have to run vertically, but can also run laterally coming from above.

In FIG. 4b, the channels 2 are closer to the region adjacent to the object 6 to be cooled and expand continuously in the direction towards the surface 4. This then creates a reverse chimney effect.

Other advantageous geometries are naturally also conceivable.

The production of the structured substrate can be performed in various ways. A first possibility is forming the structures in the substrate by various etching processes. Another possible process for forming the structure in the substrate is the use of stamping processes (hot or cold) to transfer structures onto a substrate. These two fundamentally different processes can also be used in combination. For example, the partial structures with continuous pores or channels can be produced with the help of etching processes and an optional structured substrate applied between this structure and the heat source can be produced with the help of stamping processes.

Another process for forming structures in the substrate is the known LIGA process (lithography and electroforming). This process is also suitable for the production of deep vertical structures. Depths of up to ca. 1 mm (=1000μ) can be achieved. Here, a carrier layer made from a material (e.g., plastic) coated with a heat-conductive material can be shaped directly. For this variant or for the production of an element for the entire cooling device with the help of the LIGA process, no etching steps are required. The resulting advantages are obvious. The only necessary steps for this processing variant are: mask production, lithography (e.g., X-ray lithography), electroforming, removal from mold, filling, e.g., with plastic, removal from mold. The plastic form is identical to the mask. The plastic form can then be coated with the heat-conductive material. The form created by electroforming then forms the production model for additional cooling devices made from plastic with heat-conductive coating. Otherwise, all of the previously mentioned facts are valid and all or individual parts of the previously described process can be adopted or included.

The application of the heat-conductive layer or layers can be performed, e.g., through vapor deposition. This creates excellent contact between the heat source and the cooling device, because this process prevents the formation of cavities between these components.

Tapered channels can usually be formed, e.g., through anisotropic, wet-chemical etching solutions, wherein, e.g., V-shaped recesses can be formed in [100] silicon and U-shaped recesses can be formed in [110] silicon.

FIG. 3 shows a refinement of the invention, for which the heat-inlet surface of the substrate has slots or grooves 9, which are in flow connection with the channels 2. In this way, coolant, e.g., air at the ambient temperature can flow into these slots 9 and can conduct and dissipate heat from the surface of the object to be cooled to the channels 2.

In the embodiment of FIG. 3, the cooling device has a two-part setup, whose first part is the structured substrate 1 described above, while the second part of the cooling device of this embodiment is a second substrate 10, which is arranged between the heat source and the first substrate 1 and which features a channel structure with the slots or grooves 9. Here, these slots 9 run parallel to each other and parallel to the surface of the heat source, as well as naturally also parallel to the bottom side of the first substrate. Obviously, other configurations for the structure are possible. The second substrate 10 has the task of improving the supply of ambient medium for heat dissipation. In stationary operation, it forms a type of chimney discharge, for which heat from the heat source is dissipated through continues convection. The second substrate 10 is preferably thinner than the first substrate 1 and also carries on its bottom side the heat-conductive layer 3. Here, two basic variants are possible, namely one, for which the slots or grooves 9 are in flow connection with the channels 2, which is clearly illustrated by the slot 9' and the channel 2' in FIG. 3, and the second substrate 10 thus has openings or pores also running vertically, and a second variant, for which there is no flow connection between the slots 9 and the channels 2, which can be seen in FIG. 3 with channel 2".

Deviating from the embodiment of FIG. 3, the entire cooling device with the channels 2 and the slots 9 can also be formed in one piece, which is possible, in turn, through an etching process. For the two-part structure of FIG. 3, the two substrates 1 and 10 are structured separately and then connected aligned with each other for heat conduction, e.g., with a heat-conductive adhesive. The coating can be performed analogous to the embodiments of FIG. 2. If the heat source is a microprocessor or another electronic component, the cooling device of the present invention can be formed on the microprocessor during the production of the microprocessor. In particular, if the microprocessor is mounted on a silicon chip, the cooling device can be integrated in the microprocessor. This reduces the number of production steps, reduces the adjustment expense for mounting the cooling device on the microprocessor, accelerates the production, increases the yield during the processor production, and decreases the total costs. If the cooling device is integrated in the heat source, such as, e.g., a microprocessor, then this can be realized over the entire surface of the heat source in simple ways known to someone skilled in the art, such as, e.g., the etching and lithography processing mentioned above. If desired, the cooling device can even be formed "recessed" into the microprocessor, i.e., the top side of the cooling device is flush with the top side of the microprocessor.

In FIG. 5 a substrate 11 can be seen with a plurality of channels 12, which extend through the thickness of the substrate 11. Here, the substrate is a rectangular body with one surface that has a layer 13 made of heat-conductive material. This surface will be referred to in the following as the heat-inlet surface. It is in direct contact with an object 16 to be cooled, which can be, e.g., a microprocessor, a chip, another type of electronic or electrical component, or even another type of body to be cooled.

The substrate 11 consists of, e.g., silicon or a similar material. The structure of the substrate, i.e., here the channels 12, is formed with the help of suitable lithography and etching processes, like those used in the semiconductor industry. In this way, the structure can be formed in a precisely defined way, in that, e.g., the number, dimensions, as well as arrangement or spatial distribution of the channels 12 can be predetermined. By selecting the parameters, a ratio of heat-dissipation surface to heat-inlet surface of, e.g., 400 to 700 or more can be achieved. Here, the heat-dissipation surface is not only the surface 14 of the substrate, but primarily the relatively much larger inner surface of the channels 12. These inner surfaces, the surface 14, as well as the side surfaces, with the exception of the heat-inlet surface, form the heat-dissipation surface. Naturally, all of the other embodiments illustrated in the original patent for the structured substrate are also possible and hereby included.

In addition, at least one surface of the heat-dissipation surface, but preferably all heat-dissipation surfaces, i.e., also the channels, are provided with a rough surface. This roughening is performed, e.g., by applying heat-conductive particles 21 on the already structured substrate. These particles can be applied directly onto the substrate. If some of the surfaces of the substrate are provided with a heat-conductive layer 13, then these particles 21 are applied onto the heat-conductive layer 13. This roughening of the surface further increases the heat-dissipation surface. The enlargement factor is equal to at least 2, preferably more than 10 or higher, relative to the embodiments of FIGS. 1 to 4. In this way, the ratio of heat-dissipation surface to heat-inlet surface can equal 1000 to 7000 or more.

The dimensions of particle 21 are on the order of magnitude of a few micrometers or smaller, particularly down to the range of a few nanometers. Such particles can consist of, e.g., metal oxides, such as, e.g., iron oxide. Other materials are naturally also possible.

Instead of individual particles, a porous, sponge-like, thin oxide layer can also be applied.

The increased surface produces an improved heat coupling between the surface and an incoming fluid, such as, e.g., air. In addition, the heat radiation is also improved. According to the Stefan-Boltzmann Law, the radiated power is proportional to the radiation surface, i.e., here the heat-dissipation surface, and the fourth power of the temperature ($T^4$). Therefore, the net radiation power of a body at the temperature T for an ambient temperature of $T_0$ is represented as follows:

$$Pnet = e\sigma A(T^4 - T_0^4),$$

where e is the emissivity (0<e<1) and $\sigma$ is the Stefan-Boltzmann constant (=5.6703×10$^{-8}$ W m$^{-2}$ K$^{-4}$). The material properties of the coating are included in the emissivity e.

A good emissivity e is obtained with metals (Al, Cu, etc.) or oxide compounds, which are deposited through vaporization processes.

FIG. 6 shows schematically an enlarged cut out of a cross section of substrate 11, for which channels 12 also run through the substrate, but the side walls of the channels are inclined to the vertical. In cross section, the channel walls form a trapezoidal shape aligned away from the heat source 16. The "natural angle" of this trapezoidal structure (frustum of a pyramid), e.g., for silicon as the base material, can be equal to 54.76°. This angle can be varied through corresponding change in position of the crystal planes. Here, the channel walls are also coated with particles 21, which increases the heat-radiating surface. If the channel walls are coated with a heat-conductive layer 17, then this layer is provided with the particles 21. This also applies with reference to the surface 14 with the heat-conductive layer 8, as well as to the bottom side with the heat-conductive layer 13.

Obviously, in the case where the cooling device is not integrated with the heat source, the cooling device can be attached over the entire surface with one of the processes described above, e.g., with a small distance between the individual cooling devices or also partially contiguous.

Obviously the cooling device according to the invention can also be used for heat sources other than microprocessors. For additional support of the cooling function, fans or other ventilation devices can also naturally still be used. Furthermore, it is possible to arrange the cooling device according to the invention spatially separated from the heat source and then to connect the cooling device to the heat source through a heat conductor.

The invention claimed is:

1. A substrate of a cooling device comprising
   a heat-inlet surface that can be brought into thermal contact with an object to be cooled, wherein the heat-inlet surface includes grooves, and
   a heat-dissipation surface significantly larger than the heat-inlet surface due to channels formed in the substrate, the channels being fluidly connected to the grooves of the heat-inlet surface.

2. A substrate according to claim 1 wherein the ratio of heat-dissipation surface to heat-inlet surface is greater than 10.

3. A substrate according to claim 1 wherein the ratio of the heat-dissipation surface to the heat-inlet surface is approximately 400 to 700 or greater.

4. A substrate according to claim 1 wherein the channels extend through the substrate and are essentially perpendicular to the heat-inlet surface.

5. A substrate according to claim 4 wherein the inner walls of the channels are provided with a coating made of heat-conductive material.

6. A substrate according to claim 4 wherein the channels have square, rectangular, or circular cross sections.

7. A substrate according to claim 1 wherein at least the heat-inlet surface is provided with a coating made of heat-conductive material.

8. A substrate according to claim 1 wherein the surface of the substrate opposite the heat-inlet surface is provided with a coating made of a heat-conductive material.

9. A substrate according to claim 8 further comprising a first substrate and a second substrate, wherein the second substrate is in heat-conducting contact with the first substrate, wherein there are grooves in the second substrate and the coating made of heat-conductive material is deposited on the second substrate.

10. A substrate according to claim 9, wherein the second substrate is thinner than the first substrate.

11. A substrate according to claim 1 wherein the grooves are parallel to each other and parallel to the heat-inlet surface.

12. A substrate according to claim 4 wherein the channels have cross sections that change in the longitudinal direction of the channels (direction of flow).

13. A substrate according to claim 1 wherein the heat-dissipation surface is further increased by roughening.

14. A substrate according to claim 13 wherein the roughening is generated by deposited particles.

15. A substrate according to claim 14 wherein the particles are heat conductive.

16. A substrate according to claim 15 wherein the particles are metal or metal-oxide particles.

17. A substrate according to claim 14 wherein the diameter of the particles is on the order of magnitude of micrometers or nanometers.

18. A substrate according to claim 13 wherein the particles are deposited directly on the substrate.

19. A substrate according to claim 13 wherein the particles are deposited on a heat-conductive coating deposited on the substrate defining the heat-inlet surface.

20. A substrate according claim 13 wherein the substrate has a trapezoidal cross section, wherein inclined side walls are also coated with the particles.

21. A substrate according to claim 13 characterized in that the roughening of the heat-dissipation surface is performed by a deposited, sponge-like, porous layer.

22. A process of making a substrate of a cooling device comprising:
   forming a plurality of channels in the substrate to at least in part define a heat-dissipation surface, and
   depositing a heat conductive layer on a surface of the substrate, the heat conductive layer having a plurality of grooves in fluid connection with the channels of the substrate and defining a heat-inlet surface that can be brought into thermal contact with an object to be cooled.

23. Process according to claim 22 wherein the channels are formed by etching.

24. Process according to claim 23 wherein the channels are etched by anisotropic etching and have a diameter or cross section that changes over their longitudinal direction.

25. Process according to claim 22 wherein the channels are formed at least in part by a stamping process.

26. Process according to claim 22 wherein the channels are formed by a process using lithography and electroforming.

27. Process according to claim 22, wherein the heat-conductive layer is applied by vapor deposition.

28. Process according to claim 22, wherein the heat-conductive layer consists of silver, copper, aluminum, or materials with at least approximately the same good thermal conductivity ($\lambda$).

29. Process according to claim 22, wherein the heat-conductive layer is thinner than the substrate.

30. Process according to claim 29 wherein the heat-conductive layer has a thickness of ca. 10$\mu$.

* * * * *

UNITED STATES PATENT AND TRADEMARK OFFICE
CERTIFICATE OF CORRECTION

PATENT NO. : 7,044,212 B1
APPLICATION NO. : 10/362865
DATED : May 16, 2006
INVENTOR(S) : Hofmann It is certified that error appears in the above-identified patent and that said Letters Patent is hereby corrected as shown below:

TITLE PG. ITEM 73, Assignee: "NET Nanofiltertechnik GmbH" should read -- NFT Nanofiltertechnik GmbH --.

TITLE PG. ITEM 22, PCT Filed: "August 25, 2000" should read -- August 7, 2001 --.

Signed and Sealed this

Twelfth Day of September, 2006

JON W. DUDAS
*Director of the United States Patent and Trademark Office*